United States Patent [19]
Caggiano et al.

[11] Patent Number: 5,744,976
[45] Date of Patent: Apr. 28, 1998

[54] FLOATING GUIDE PLATE TEST FIXTURE

[75] Inventors: Raymond J. Caggiano, Mecklenburg County; Jeffrey A. Hatley, Cabarrus County, both of N.C.

[73] Assignee: International Business Machines Corporation, Armonk, N.Y.

[21] Appl. No.: 653,189

[22] Filed: May 24, 1996

[51] Int. Cl.$^6$ .................................................. G01R 31/02
[52] U.S. Cl. ................................................ 324/761; 324/758
[58] Field of Search .................................... 324/761, 754, 324/755, 758

[56] References Cited

U.S. PATENT DOCUMENTS

| | | | |
|---|---|---|---|
| 4,061,969 | 12/1977 | Dean | 324/761 |
| 4,115,735 | 9/1978 | Stanford | 324/754 |
| 4,538,104 | 8/1985 | Douglas et al. | 324/754 |
| 4,626,776 | 12/1986 | Wilkinson | 324/761 |
| 4,746,861 | 5/1988 | Nesbitt | 324/761 |
| 4,771,234 | 9/1988 | Cook et al. | 324/754 |
| 4,783,624 | 11/1988 | Sabin | 324/758 |
| 4,870,354 | 9/1989 | Davaut | 324/757 |
| 4,935,695 | 6/1990 | Hayes et al. | 324/761 |
| 4,935,696 | 6/1990 | DiPerna | 324/761 |
| 5,325,052 | 6/1994 | Yamashita | 324/754 |
| 5,416,428 | 5/1995 | Swart | 324/761 |
| 5,534,787 | 7/1996 | Levy | 324/754 |

FOREIGN PATENT DOCUMENTS

92/0578   9/1991   Ireland.

*Primary Examiner*—Ernest F. Karlsen
*Assistant Examiner*—Anh Phung
*Attorney, Agent, or Firm*—Whitham, Curtis & Whitham; Richard Goldman

[57] ABSTRACT

A test fixture for testing circuit boards includes a field of upwardly projecting test probes. The circuit board to be tested includes a plurality of test points to be contacted by a corresponding test probe. The circuit board is fixed to a floating guide plate having apertures therethrough aligned with the test points. As the floating guide plate is lowered over the test probes the guide plate is permitted to float in a lateral direction to achieve proper alignment between the probes and the apertures. Once aligned, the probes continue to pass through the apertures to make contact with their respective test points.

15 Claims, 4 Drawing Sheets

FLOATING GUIDE PLATE TEST FIXTURE

BACKGROUND OF THE INVENTION

1. Field of the Invention

The present invention generally relates to test fixtures for circuit boards and, more particularly, to automated test fixtures for aligning undersized test points on a circuit board with test probes.

2. Description of the Prior Art

As the number of components on circuit boards increase, testing the integrity of the circuit boards becomes an increasingly daunting task. Circuit board designers are constantly faced with the challenge of packaging more and more electronics into a smaller amount of space. Often, there is little that can be done concerning the size or number of components required for a given function. Hence, where possible, other physical attributes of the circuit board design, such as the test points, are often minimized or eliminated.

Test points are necessary on circuit boards to allow interconnection to test equipment via a test fixture. A test fixture is typically an automated device which comprises a plurality of fixed upwardly projecting test probes. Each of the test probes correspond to a test point on the circuit board such that when the board is pulled down on top of the probes, each probe is brought into electrical contact with its corresponding test point.

The minimum permissible test point size which can be contacted by current fixtures hinders the designer's ability to meet circuit board size objectives. Therefore, test points are sometimes omitted for portions of a given board design or, alternatively, if test points are provided they may be of a diameter too small for the fixture to contact reliably. Omitted test points result in portions of the board going untested and thereby jeopardizing product quality. Similarly, if the test points are too small to reliably contact the test probes, manufacturing costs are increased due to retest cycles and delays.

FIG. 1 shows an example of a test fixture for testing circuit boards generally referred to by the reference numeral 10. The test fixture 10 comprises a probe plate 12 having a plurality of upwardly projecting test probes 14. Each of the test probes 14 correspond to a test point 16 on the circuit board under test 18. The circuit board 18 sits on blocks 20 above a rigid guide plate 22. A tooling pin or guide pin 24, fixed to guide plate 22, fits into an alignment bushing in the circuit board 18 to provide alignment for the test probes 14 and the test points 16. The guide plate 22 must be made of a non-conductive material so as not to interfere with the electrical probes 14. When a vacuum chamber 28, defined by a vacuum mat 30 and vacuum seal 32, is evacuated of air, atmospheric pressure pushes down on the vacuum mat 30 compressing springs 26 and causing the guide plate 22 to move in a downward direction along guide pin 34. A backer plate 36, connected to the guide plate 22, pushes down on backer post 38 which, in turn, pushes down on the circuit board 18 under test. Guide apertures 40 allow probe tips 42 to slide therethrough and make electrical contact with the test points 16.

The total alignment error for the text fixture is the aggregate of all alignment errors introduced at the various alignment points of the individual fixture parts. This necessitates the need for relatively large guide apertures 40. The summation of these and other alignment tolerances yields a probe-center to test-point-center misalignment of 0.017" to 0.027" (0.43 to 0.69 mm). Therefore, the diameter of the test points designed onto the circuit board must be at least twice these values to ensure proper electrical contact (i.e., 0.034" to 0.054" or 0.86 to 1.37 mm).

When test points smaller than 0.05" (1.27 mm) are manufactured on a circuit board under test, a guided probe test fixture may be used as shown in FIG. 2. The basic fixture assembly is the same as that shown in FIG. 1. Accordingly, like elements are labeled the same. However, in FIG. 2, the rigid guide plate 22 has affixed thereto a funnel plate 23. The funnel plate 23 has apertures 40' which are smaller in diameter than the apertures 40 in the guide plate 23 and thereby bias the probe tips 42 to establish a closer dimensional relationship to the target test points 16. Experience and experimentation have shown that test point diameters as small as 0.025" (0.64 mm) are achievable; however, most of the misalignment tolerances for the standard fixture still apply. The funnel plate 23 may be made of nylon or similar reduced-friction polymer materials to minimize binding. However, the probe tips 42 still occasionally rub or drag on the funnel plate 23 causing binding which, in turn, results in a degradation in contact force.

FIG. 3 shows a split probe fixture which provides even greater accuracy. As the name implies, the probes 14 are split at the tips 42. Small piston-type probes 43 are installed directly into the guide plate apertures 40. This split probe design serves to further reduce the misalignment tolerances between the probes 43 and test points 16 since a lessor number of component errors are involved. For example, the errors in the probe plate no longer contribute to the misalignment since the probe plate is unrelated to the piston-type probes and the probe points.

While being able to effectively contact smaller test points than the previously mentioned test fixtures, this split probe technique has several disadvantages. First, this type of fixture is quite expensive where the price per probe may be doubled. Second, maintenance is difficult since the piston probe tips 43 are pressed into the guide plate 22. As with all mechanical devices, wear is a problem. The guide plate 22 can only withstand a finite number of insertions before it must be rebuilt or replaced. Lastly, contact impedance may become a factor. Contact impedance is usually not of concern for circuit tests where signal speeds are low. However, for functional applications, each point of contact within the signal path yields a ringing effect to some degree, depending upon the resulting impedance established between the two contact surfaces. In the extreme, ringing can adversely affect a test due to the resulting signal attenuation.

SUMMARY OF THE INVENTION

It is therefore an object of the present invention to provide a circuit board test fixture with a self-aligning feature while maintaining the lower cost of a guided probe fixture.

It is yet another object of the present invention to provide an automated test fixture for aligning undersized test points on a circuit board with test probes.

According to the invention, a vacuum actuated test fixture for testing circuit boards (cards) includes a plurality of upwardly projecting test probes. A circuit board to be tested includes a plurality of test points to be contacted by a corresponding test probe. The circuit to be tested is fixed to a floating guide plate having apertures therethrough aligned with the test points. As the floating guide plate is lowered over the test probes the guide plate is permitted to float in a lateral direction to achieve proper alignment between the probes and the apertures. Once aligned, the probes continue to pass through the apertures to make contact with their respective test points. In addition, a card tooling pin is provided which securely aligns the circuit board under test to the floating guide plate. The tooling pin also establishes loose alignment of the floating plate with respect to the probes during floating plate installation.

BRIEF DESCRIPTION OF THE DRAWINGS

The foregoing and other objects, aspects, and advantages will be better understood from the following detailed description of a preferred embodiment of the invention with reference to the drawings, in which.

DETAILED DESCRIPTION OF A PREFERRED EMBODIMENT OF THE INVENTION

Figure 4:
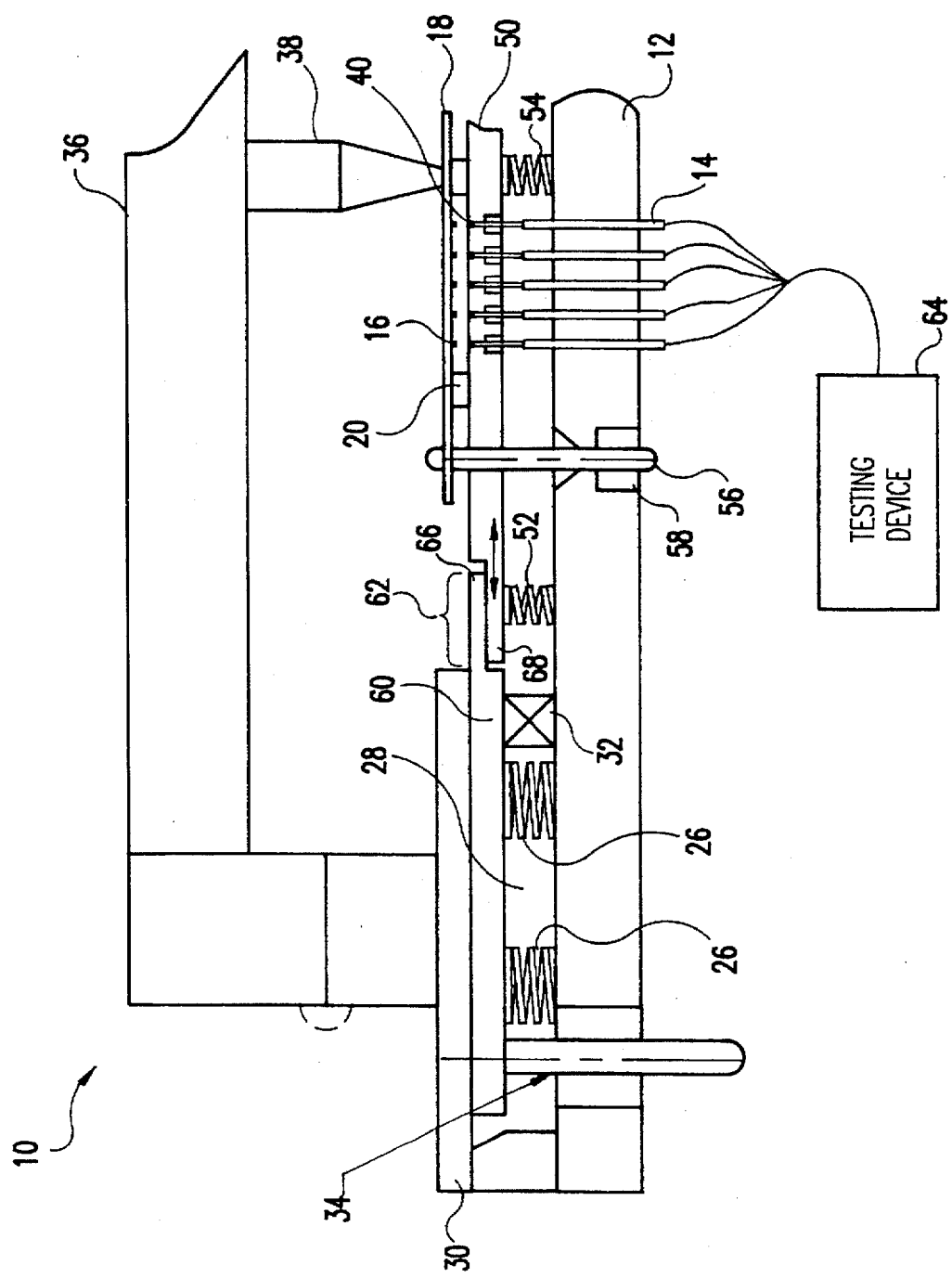
FIG. 4 is a diagram showing a floating guide plate test probe fixture according to the present invention.

Referring now to the drawings, and more particularly to FIG. 4, there is shown the floating guide plate test probe fixture according to the present invention generally referred to by the reference numeral 11. The test fixture 11 comprises a probe plate 12 having a field of upwardly projecting test probes 14. Each of the test probes 14 correspond to a test point 16 on the circuit board 18 under test.

Unlike the previously described test fixtures, the test fixture of the present invention includes a floating guide plate 50 onto which the circuit board under test 18 is secured atop of blocks 50. The floating guide plate 21 floats on return springs 52 and 54 and is captured by vacuum chamber plate upper lip 66. A press fit card tooling pin 56, securely aligns test points 16 with guide plate apertures 40. The pin 56 also establishes loose alignment between the floating plate 50 and the probe plate 12. The pin 56 fits relatively loosely in pin aperture 58 to permit the floating guide plate 50 to float. Additionally, this relaxed fit 58 helps avoid undue stress to the probes 14 from any transverse loading that may be experienced during pull-down since the total amount of float is limited by the fit.

Figure 3:
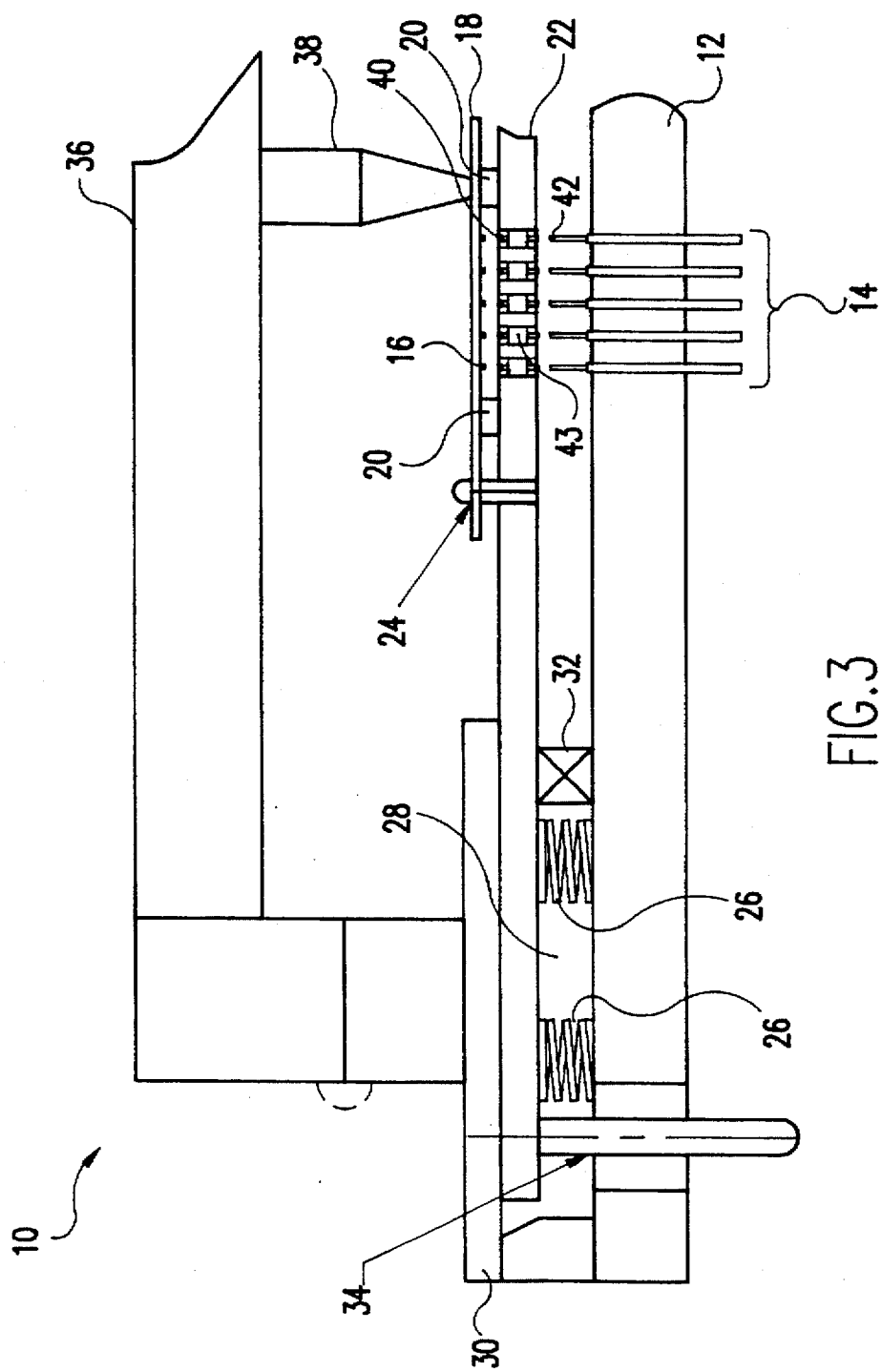
FIG. 3 is a diagram showing a related split probe test fixture for aligning test probes to test points on a circuit board.

The floating guide plate 50, establishes a dimensional relationship between the probe field 14 and the board 18 under test to achieve a total possible misalignment of only 0.008 to 0.012 inches (0.2 to 0.3 mm), thus permitting the probes to reliably contact undersized test points. Note that the resulting tolerance is equivalent to the split probe fixture shown in FIG. 3; however, the present invention has the advantage of using standard probes thereby reducing initial cost as well as maintenance costs.

Figure 1:
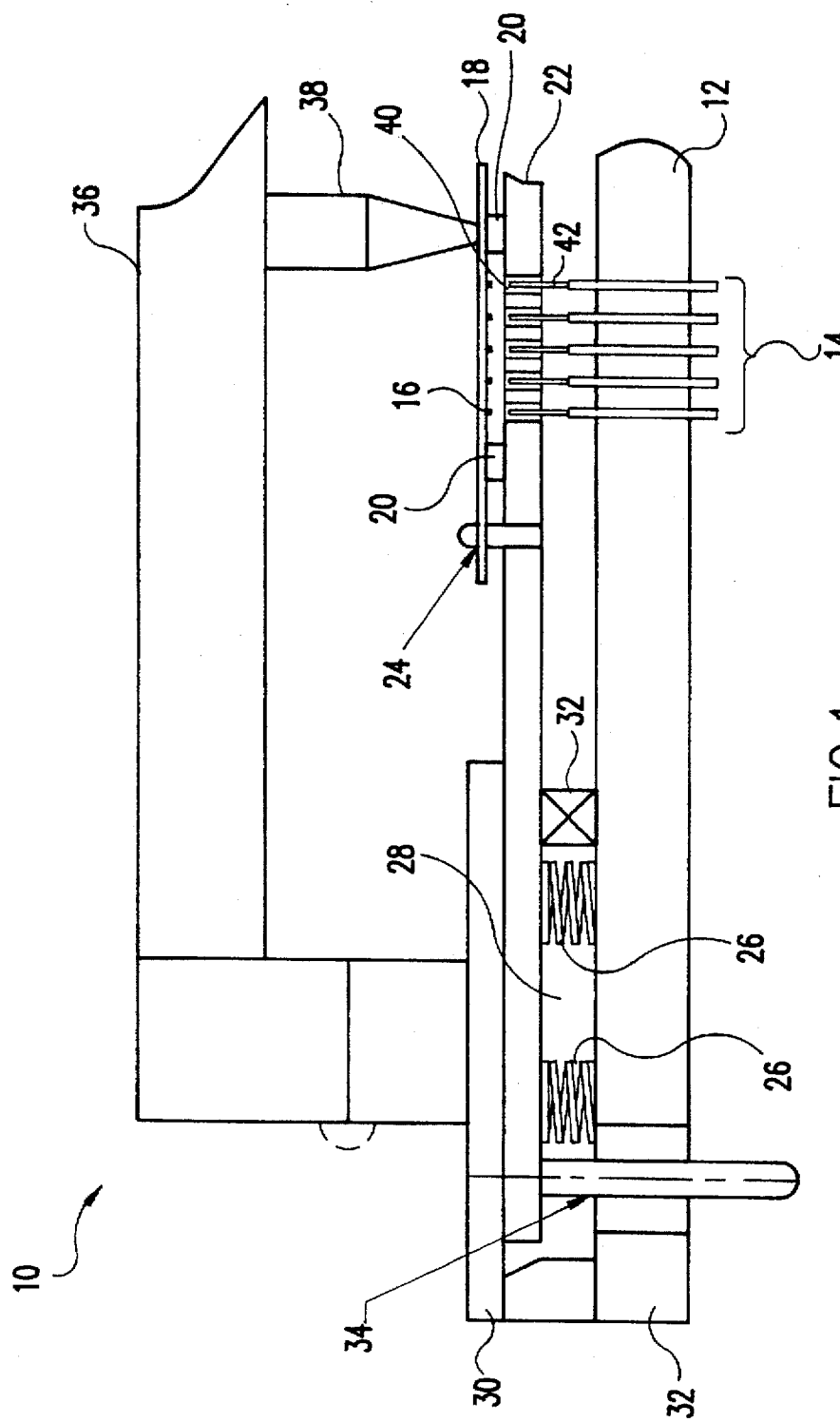
FIG. 1 is a diagram showing a related test fixture for aligning test probes to test points on a circuit board.
Figure 2:
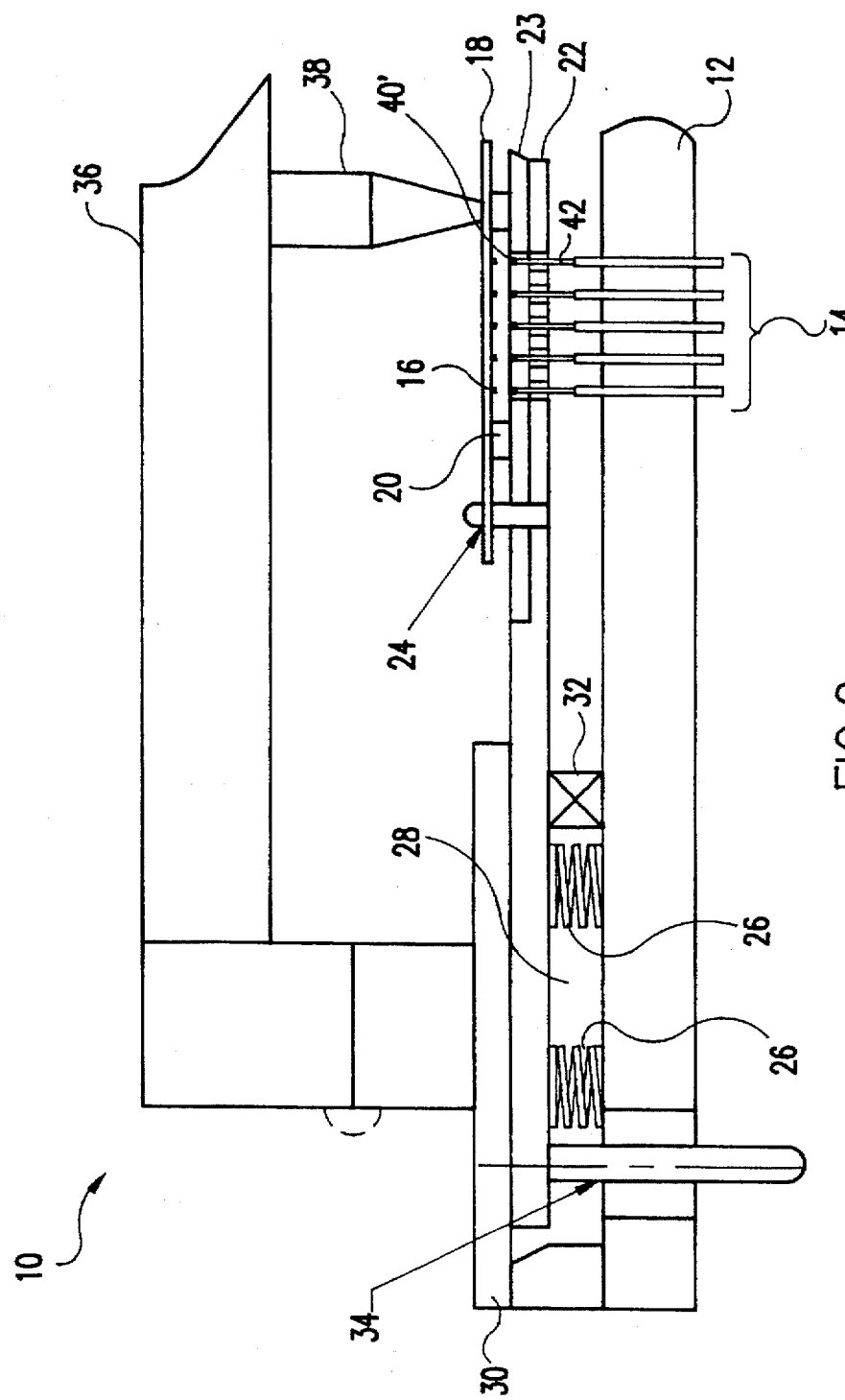
FIG. 2 is a diagram showing a related guided probe test fixture for aligning test probes to test points on a circuit board.

The floating guide plate 50 is preferably constructed of a low friction polymer to help prevent binding, similar to the guide plate of a guided probe fixture shown in FIG. 2. However, lower cost is possible since the floating plate 50 simply rests on top of support springs, 52 and 54, rather than being aligned and fixedly assembled to a top plate as with a guided probe fixture. Also, the floating guide plate 50 of the present invention moves laterally during a pull-down. Hence, funnel shaped apertures 40 may be used having smaller through openings at the probe emerging end thus further increasing pointing accuracy.

A vacuum chamber plate 60, performs the primary function of applying force to the circuit board under test 18 for contact with the probes 14. When air is removed from the vacuum chamber 28, the vacuum mat 30 and vacuum chamber plate 60 translate downward from atmospheric pressure along guide pin 34. A hinged backer gate arm 36 moves with the vacuum chamber plate 60 and transfers force to the circuit board 18 with backer posts 38 compressing spring 54. Simultaneously, the vacuum chamber plate 60 has an upper lip 66 which pushes down on a lower lip 68 of the floating guide plate 50 thus compressing spring 52. Spaces 62 are left to allow the lower lip 68 of the guide plate 50 to slip under the upper lip 66 to permit limited lateral movement of the floating guide plate 50 during a pull-down operation. Since the vacuum chamber plate 60 and the floating guide plate 50 are not continuous, overall strength or resistance to flexure is reduced. However, non-conductivity is no longer a requirement for the chamber plate 60 since it does not contact the probes. Hence, the chamber plate 60 may be constructed of materials stronger than standard fixture plates such as structural aluminum or steel.

As shown in FIG. 4, a testing device 64, such as a programmable signal generator or meter, may be connected to the probes 14. Once the circuit board 18 is pulled down, test signals are supplied through selected probes to the test points 16 on the board 18, while other probes read the resultant signals at other test points 16. In this manner, the integrity of the circuit board can be automatically tested.

While the invention has been described in terms of a single preferred embodiment, those skilled in the art will recognize that the invention can be practiced with modification within the spirit and scope of the appended claims.

We claim:

1. A circuit board test fixture, comprising:

a probe plate for holding a plurality of test probes in a fixed position;

a floating guide plate having a plurality of apertures therethrough corresponding to said plurality of test probes, said floating guide plate having a perimeter lip;

mounting means for fixing a circuit board under test above said guide plate, the circuit board having a plurality of test points to be contacted by said plurality of test probes; and spring means, between said probe plate and said floating guide plate, for permitting said guide plate to float laterally with respect to said perimeter lip such that said plurality of apertures align with said plurality of test probes when said floating guide plate is pulled down through said plurality of test probes.

2. A circuit board test fixture as recited in claim 1 wherein each of said plurality of apertures is funnel shaped.

3. A circuit board test fixture as recited in claim 1, further comprising a card tooling pin for firmly securing the circuit board under test to said floating guide plate and loosely securing said floating guide plate to said probe plate.

4. A circuit board test fixture as recited in claim 3, further comprising actuation means for pulling down said floating guide plate through said plurality of probes.

5. A circuit board test fixture comprising:

a probe plate for holding a plurality of test probes in a fixed position;

a floating guide plate having a plurality of apertures therethrough corresponding to said plurality of test probes;

mounting means for fixing a circuit board under test above said guide plate, the circuit board having a plurality of test points to be contacted by said plurality of test probes;

spring means, between said probe plate and said floating guide plate, for permitting said guide plate to float laterally such that said plurality of apertures align with said plurality of test probes when said floating guide plate is pulled down through said plurality of test probes;

a card tooling pin for firmly securing the circuit board under test to said floating guide plate and loosely securing said floating guide plate to said probe plate; and actuation means for pulling down said floating guide plate through said plurality of probes, wherein said actuation means comprises:
- a vacuum chamber normally biased to an expanded position;
- a vacuum chamber plate having a upper lip portion extending over a lower lip portion at a first end of said floating guide plate; and
- an arm extending from said vacuum chamber plate to a second end of said floating guide plate, wherein when said vacuum chamber is evacuated of air, said vacuum chamber plate pushes down on said first end of said floating guide plate and said arm pushes down on the circuit board and causes said plurality of apertures to be lowered through said plurality of test probes.

6. A circuit board test fixture as recited in claim 5, wherein said vacuum chamber plate comprises an electrically conductive material.

7. A circuit board test fixture as recited in claim 1, further comprising a testing device for supplying test signals to, and reading test signals from, said plurality of test probes.

8. A component test machine, comprising:

probe securing means for holding a plurality of test probes in a fixed position, said plurality of test probes for supplying signals to and receiving signals from test points on a component;

a guide plate having a plurality of apertures therethrough for aligning with the test points, said guide plate having a perimeter lip;

component holding means for holding the component in a fixed position relative to said guide plate;

guide plate holding means for loosely holding said guide plate relative to said probe securing means; and spring means for simultaneously allowing said guide plate to float vertically and slide laterally with respect to said perimeter lip to facilitate alignment of said plurality of test probes through said apertures to contact the test points of the component.

9. A component test machine as recited in claim 8 further comprising:

a testing device having leads connected to each of said plurality of test probes for supplying test signals to, and receiving test signals from, the component.

10. A component test machine as recited in claim 8 wherein said apertures are funnel shaped.

11. A component test machine as recited in claim 8 further comprising vacuum actuation means for causing said guide plate to be pulled down over said plurality of test probes.

12. A component test machine as recited in claim 11 wherein said vacuum actuation means comprises an electrically conductive vacuum chamber plate.

13. A method for testing components, comprising the steps of:

fixing a plurality of test probes in a vertical position;

securing test points of a component above apertures in a guide plate;

lowering said guide plate over said plurality of test probes by pushing down on a lip of said guide plate;

floating said guide plate in a lateral direction with respect to said lip while performing said step of lowering such that said apertures in said guide plate align with said plurality of test probes; and contacting said plurality of test probes to corresponding ones of said test points.

14. A method for testing components as recited in claim 13, further comprising the step of shaping said apertures into a funnel shape having a narrower end nearest said component.

15. A method for testing components as recited in claim 13, further comprising the step of evacuating a vacuum chamber of air to actuate said step of lowering.

* * * * *